(12) United States Patent
Singleton et al.

(10) Patent No.: US 12,341,335 B2
(45) Date of Patent: Jun. 24, 2025

(54) PROTECTION CIRCUITRY

(71) Applicant: Cirrus Logic International Semiconductor Ltd., Edinburgh (GB)

(72) Inventors: David P. Singleton, Edinburgh (GB); Andrew J. Howlett, Edinburgh (GB); Sharjeel Riaz, Edinburgh (GB); John B. Bowlerwell, Dunfermline (GB)

(73) Assignee: Cirrus Logic Inc., Austin, TX (US)

( * ) Notice: Subject to any disclaimer, the term of this patent is extended or adjusted under 35 U.S.C. 154(b) by 179 days.

(21) Appl. No.: 18/183,817

(22) Filed: Mar. 14, 2023

(65) Prior Publication Data

US 2023/0299575 A1    Sep. 21, 2023

Related U.S. Application Data

(60) Provisional application No. 63/319,836, filed on Mar. 15, 2022.

(51) Int. Cl.
*H02H 7/00* (2006.01)
*H02H 1/00* (2006.01)
*H02H 7/20* (2006.01)

(52) U.S. Cl.
CPC ............ *H02H 7/20* (2013.01); *H02H 1/0007* (2013.01)

(58) Field of Classification Search
None
See application file for complete search history.

(56) References Cited

U.S. PATENT DOCUMENTS

| | | | |
|---|---|---|---|
| 2002/0186156 A1 | 12/2002 | Inagaki et al. | |
| 2016/0190794 A1 | 6/2016 | Forghani-Zadeh et al. | |
| 2020/0028352 A1* | 1/2020 | Strouse | H05K 7/1457 |
| 2020/0083704 A1 | 3/2020 | Huang et al. | |
| 2022/0399800 A1* | 12/2022 | Liu | H02M 7/537 |
| 2023/0076383 A1* | 3/2023 | Jenkins | G05F 1/56 |

FOREIGN PATENT DOCUMENTS

| | | |
|---|---|---|
| EP | 3525344 A1 | 8/2019 |
| WO | 2007025260 A2 | 3/2007 |

OTHER PUBLICATIONS

Search and Examination Report under Sections 17 and 18(3), UKIPO, Application No. GB2303745.0, mailed Mar. 1, 2024.
Combined Search and Examination Report under Sections 17 and 18(3), UKIPO, Application No. GB2303745.0, mailed Oct. 9, 2023.

* cited by examiner

*Primary Examiner* — Stephen W Jackson
(74) *Attorney, Agent, or Firm* — Jackson Walker L.L.P.

(57) ABSTRACT

An integrated circuit (IC), comprising: a converter comprising: one or more core devices; and one or more output internal nodes, each internal node coupled to one of the one or more core devices; protection circuitry comprising: one or more isolation switches, each of the one or more isolation switches coupled between a respective one of the one or more internal output nodes and a respective output external pin of the IC, wherein the protection circuitry configured to: monitor a characteristic at each respective external output pin of the IC; and if the characteristic is outside an operating specification of the one or more core devices, open one or more of the one or more isolation switches to isolate one or more of the one or more core devices from the respective external pin of the IC.

24 Claims, 6 Drawing Sheets

PROTECTION CIRCUITRY

TECHNICAL FIELD

The present disclosure relates to protection circuitry, in particular for integrated circuits.

BACKGROUND

It is conventional in integrated circuit (IC) design to provide converters, such as digital-to-analog converters (DACs) and analog-to-digital converters (ADCs), on an IC, optionally in addition to other components, such as amplifiers. Switching elements of such converters often have lower operating voltages than the voltage domain of the IC onto which they are integrated. In which case, care must be taken to ensure the switching elements are not exposed to voltages exceeding their operating threshold. This problem is exacerbated when outputs of such converters are coupled to external pins of the IC since it can be more difficult to control conditions at such external pins.

SUMMARY

Embodiments of the present disclosure aim to address or at least ameliorate one or more of the above problems by providing protection circuitry on an IC which is configured to isolate one or more core devices of a converter (such as a DAC or an ADC) upon detection of an condition which could lead to one or more core devices operating outside of its operating specification (i.e., safe operating area) or threshold. In some embodiments, one or more isolation switches are provided for isolating respective core devices from external pins of the IC when an overvoltage condition is detected, for example at a respective external pin. In some embodiments, core devices may be controlled during start-up of the IC to ensure core devices continue to operate within their safe operating area (SOA) over the course of start-up of the IC. This is particularly applicable when the SOA of the core devices is less than the voltage domain of the IC itself, such as where the operating voltage range of the core devices is less than the operating voltage of the IC.

According to a first aspect of the disclosure, there is provided an audio converter integrated circuit (IC), comprising: a converter comprising: one or more core devices; and one or more internal nodes, each internal node coupled to one of the one or more core devices; protection circuitry comprising: one or more isolation switches, each of the one or more isolation switches coupled between a respective one of the one or more internal nodes and a respective external pin of the IC, wherein the protection circuitry configured to: monitor a characteristic at each respective external pin of the IC; and if the characteristic is outside an operating specification of the one or more core devices, open one or more of the one or more isolation switches to isolate one or more of the one or more core devices from the respective external pin of the IC.

The characteristic may comprise one or more of: a voltage; a current; and an impedance.

The operating specification may comprise a safe operating area (SOA) of the one or more core devices. Additionally or alternatively, the operating specification is set to maintain operation of the one or more core devices in a SOA.

In some embodiments, the one or more core devices have a safe operating voltage which is less than a supply voltage of the IC. Additionally or alternatively, the one or more core devices may have a safe operating current which is less than a supply current of the IC.

When the characteristics comprises an output voltage, the protection circuitry may comprise: at least one comparator configured to compare the output voltage with an internal reference voltage; and open the one or more isolation switches based on the comparison.

The audio converter IC may further comprise drive circuitry configured to hold the one or more internal nodes at an internal reference voltage when the one or more isolation switches are open.

The drive circuitry may comprise one or more potential dividers (or voltage dividers) configured to hold the one or more internal nodes at the internal reference voltage.

The drive circuitry may comprise a current source configured to generate the internal reference voltage.

The internal reference voltage may be substantially equal to half a supply voltage of the IC.

The drive circuitry may be configured to output an external reference voltage at a reference voltage pin of the IC. A level of the external reference voltage may be equal to a level of the internal reference voltage. The external reference voltage may be generated separately to the internal reference voltage. As such, conditions at the reference external pin which may affect the external reference voltage may not affect the internal reference voltage.

The one or more core devices may each comprise a transistor, such as a MOSFET, having a gate, a source and a drain.

The converter may comprise converter control circuitry configured to: apply a gate voltage to respective gates of the one or more core devices. The gate voltage may be switched between a first gate voltage level and a second gate voltage level.

During start-up of the IC, the first gate voltage level may be set to within a first threshold of a supply voltage of the IC. The converter control circuitry may be configured to apply the gate voltage to a respective gate of the one or more core devices, a difference between the first gate voltage level and the internal reference voltage of the IC being within an operating range of one or more core devices.

The first and second gate voltage levels may be derived from the internal reference voltage.

When the converter is disabled, the first gate voltage level may be set to an operating voltage of the respective core device of the one or more core devices.

When the converter is enabled, the first gate voltage level being a first threshold above the internal reference voltage. The first gate voltage level is set to ensure the respective core device is on. To ensure this condition is satisfied, the first gate voltage level is preferably set to be at least a threshold voltage (Vt) above the source voltage of the respective core device (i.e., at least VREF+Vt). This ensures that the gate-source voltage of the respective core device is at or greater than a threshold voltage Vt of that core device.

When the converter is enabled, the second gate voltage level is set to within a second threshold of the internal reference voltage. The second threshold is less than 200 mV.

The converter may comprise one or more of: a digital-to-analog converter (DAC); and an analog-to-digital converter (ADC).

The converter may comprise the DAC. The DAC may be a current DAC. The DAC may comprise a differential DAC, such as a differential current DAC.

For example, the one or more internal nodes may comprise a first internal node and a second internal node. The DAC may then comprise a differential current DAC comprising: a first switch coupled between a first internal node and a first current source; a second switch coupled between the first internal node and a second current source; a third switch coupled between a second internal node and the first current source; and a fourth switch coupled between the second internal node and the second current source. The first current source may be coupled to a first supply voltage of the audio converter IC and the second current source may be coupled to a second supply voltage of the audio converter IC, the first supply voltage being more positive than the second supply voltage.

According to a another aspect of the disclosure, there is provided an audio converter integrated circuit (IC), comprising: a converter comprising: one or more core devices; and one or more internal nodes, each internal node coupled to one of the one or more core devices; protection circuitry comprising: one or more isolation switches, each of the one or more isolation switches coupled between a respective one of the one or more internal nodes and a respective external pin of the IC, wherein the protection circuitry configured to: monitor a characteristic at each respective external pin of the IC; and if the characteristic falls outside of an functional operating region of the converter, open one or more of the one or more isolation switches to isolate one or more of the one or more core devices from the respective external pin of the IC.

According to a another aspect of the disclosure, there is provided an audio converter IC, comprising: a converter comprising: one or more core devices; and one or more internal nodes, each internal node coupled to one of the one or more core devices; protection circuitry comprising: one or more isolation switches, each of the one or more isolation switches coupled between a respective one of the one or more internal nodes and a respective external pin of the audio converter IC; and a reference voltage generator configured to provide a first reference voltage to the protection circuitry and to provide a second reference voltage to an reference external pin of the converter IC.

According to a another aspect of the disclosure, there is provided a system comprising: an audio converter integrated circuit (IC), comprising: a current digital-to-analog converter (IDAC) comprising a plurality of core devices, the differential IDAC configured to receive a digital input and switch the plurality of core devices to output an output current to one or more internal nodes, the pair of internal nodes switchably coupled to one or more external pins of the audio converter IC; a reference voltage generator configured to output a reference voltage to a reference external pin of the audio converter IC; and a gain stage coupled to the one or more external pins and the reference external pin, the gain stage configured to apply gain to the differential output current.

The first gain stage may be configured to apply a voltage bias to the one or more external pins.

According to another aspect of the disclosure, there is provided a system, comprising: an audio converter IC as described; and a gain stage coupled to the one or more external pins of the IC. The gain stage may comprise a transimpedance amplifier (TIA).

The system may further comprise: an audio transducer coupled to the gain stage, the gain stage configured to drive the audio transducer.

According to another aspect of the disclosure, there is provided an electronic device comprising the system described above.

The device may comprise one of a mobile computing device, a laptop computer, a tablet computer, a games console, a remote-control device, a home automation controller or a domestic appliance, a toy, a robot, an audio player, a video player, or a mobile telephone, and a smartphone.

According to another aspect of the disclosure, there is provided an integrated circuit (IC) arranged to receive a supply voltage, the IC comprising at least one core device (such as a converter), the output of the core device externally output to pads or pins of the IC for coupling with external circuitry such as an external amplifier, wherein the at least one core device is selected as a relatively weak electronic device, having a safe operational voltage less than the supply voltage of the IC.

By using such a weak core device in the IC, the overall IC performance may be improved or made more efficient when compared to a similar IC having core devices which are fully rated for the supply voltage. For example, a weaker device may benefit from a lower on resistance, a lower threshold voltage, lower capacitance, improved transconductance, smaller device size, etc. when compared to a "standard" device for such an IC.

The IC may further comprise protection circuitry to monitor at least one characteristic (e.g. voltage, current, impedance) of the pads or pins of the IC connected to the core device, wherein the protection circuitry is configured to prevent a Safe Operational Area (SOA) violation of the core device when the at least one monitored characteristic departs from a pre-defined specification. The specification may comprise an allowable range for the monitored characteristic that does not result in damage to the connected core device.

According to another aspect of the disclosure, there is provided an integrated circuit (IC) comprising a converter, preferably an ADC or DAC, further preferably a current DAC, the output of the converter externally output to pins of the IC for coupling with an external amplifier, wherein the IC further comprises protection circuitry between the converter and the output pins, to prevent damage to the converter from external voltages.

Optionally, the protection circuitry prevents damage during initial start-up of a system comprising the IC.

Optionally, the protection circuitry comprises a switchable voltage divider to hold the output of the core device or converter at a defined voltage level, preferably at a reference voltage VMID, until a safe operating condition for connection of the core device or converter output to an external amplifier.

Optionally, the protection circuitry comprises isolation switches between the output of the converter and the output pins, to isolate the converter output from the external pins until a safe operating condition for connection of the converter output to an external amplifier.

Optionally, the IC comprises a reference voltage generator circuit, to generate a reference voltage for an external amplifier. The reference voltage generator circuit may comprise a resistive divider and/or may be based at least in part on a reference current generated in the IC.

Optionally, the IC may be arranged to monitor output conditions at output pins of the IC, and to control operation of the protection circuity based on the monitored output conditions. In one aspect, if a pin voltage moves outside of a Safe Operational Area (SOA), the protection circuitry is configured to isolate the output of the at least one core device from the output pin.

Optionally, the IC comprises a control scheme to control operation of the protection circuitry and/or the reference voltage generator. The control scheme may comprise at least one comparator arranged to compare a voltage level at an output pin or pad of the IC with the reference voltage level. The protection circuitry may be controlled based on the comparison.

It will be understood that the core device may be any suitable converter device, such as a DAC or an ADC. In various examples, the core device is a current DAC or IDAC.

The IC may be arranged to be coupled with an amplifier for driving a transducer, such as an audio transducer.

According to another aspect of the disclosure, there is provided a circuit to receive an input signal and generate an output signal, the output signal preferably for driving a transducer, preferably an audio transducer, the circuit comprising: an amplifier, and an integrated circuit comprising a core device or converter, as described above, wherein the integrated circuit receives an input signal to be converted by the core device or converter, and wherein an output of the core device or converter drives the amplifier to generate an output signal.

According to another aspect of the disclosure, there is provided a host device, e.g. a mobile phone, a tablet computer, a laptop, a speaker system, an audio mixing desk or other electronic device, comprising an integrated circuit as described above.

According to another aspect of the disclosure, there is provided an amplifier, an audio mixing desk, or other electronic device, comprising the integrated circuit as described above Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which.

DESCRIPTION OF EMBODIMENTS

The term "core device" is used herein to refer to any semiconductor component having a limited safe operating area (SOA), that is, voltage and current ranges at which the semiconductor component can be expected to operate without stress or self-damage. Examples of such core devices include but are not limited to field effect transistors (FETs) (e.g., metal oxide semiconductor (MOS) FETs), bipolar junction transistors (BJTs), thyristors, and insulated-gate bipolar transistors (IGBTs).

Figure 1:
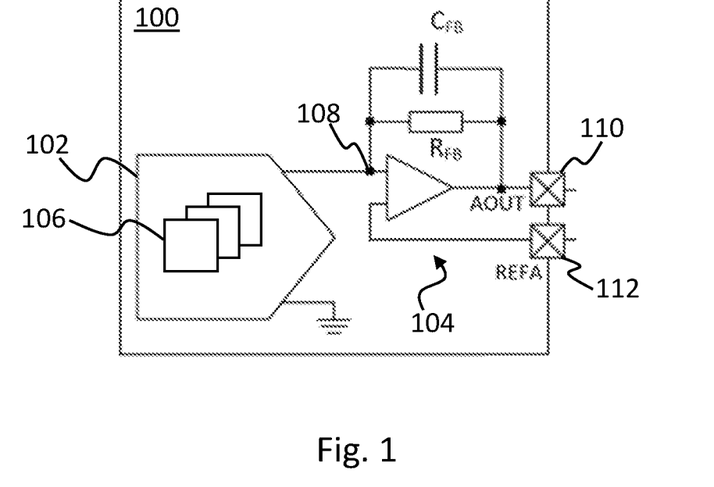
FIG. 1 is a schematic diagram of a state of the art converter integrated circuit (IC)

FIG. 1 is a schematic diagram of a conventional IC 100 comprising a DAC 102 (in this example a current DAC (IDAC)) and an amplifier 104 (in this example a transimpedance amplifier (TIA)). The DAC 102 comprises a plurality of core devices 106. The DAC 102 is configured to convert a digital signal into a current at an internal node 108 which is coupled to an input of the amplifier 104. The amplifier 104 is then configured to output a voltage AOUT, at a first external pin 110 of the IC 100, which is proportional to the current at the internal node 108. A DC bias of the output voltage AOUT is set by a reference voltage REFA generated externally and provided to a second external pin 112 of the IC 100.

The DAC 102 may be configured to operate in a voltage domain +/−VDAC (e.g., +/−1.8V), which may result in a voltage drop across the DAC 102 of 2VDAC (e.g., 3.6V). Because the output of the IDAC 102 is provided to an internal node 108 of the IC 100 (and not to external pins), and the internal node 108 can be controlled within the IC 100, the core devices 104 can be maintained within their safe operating area (SOA), reducing risk of stress and/or damage to the core devices 104.

The architecture shown in FIG. 1 provides inherent protection of the core devices 106 from conditions external to the converter IC 100, due to the presence of the amplifier 104 on the IC 100. However, for some applications, it may be desirable to provide the amplifier off chip. In doing so, an on-chip converter could be provided outputting a conversion result off chip to drive one or more external amplifiers, which in turn may provide greater flexibility in design of a circuit incorporating the converter.

Figure 2:
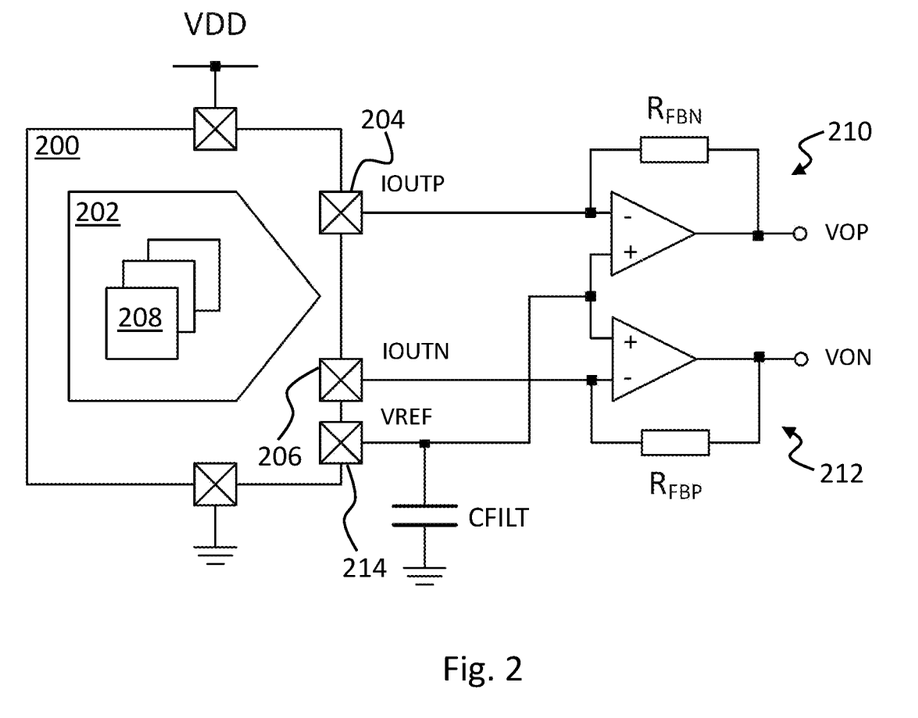
FIG. 2 is a schematic diagram of a converter IC.

FIG. 2 is a schematic diagram of a converter IC 200 comprising a DAC 202 (in this example a differential IDAC) having first and second differential outputs coupled to first and second external pins 204, 206 of the converter IC 200. The DAC 202 is thus configured to output first and second output currents IOUTN, IOUTP, which are proportional to a digital signal provided to the DAC 202, to the first and second external pins 204, 206 of the converter IC 200.

Like the DAC 102, the DAC 202 comprises a plurality of core devices 208 (in this case switching devices), each having a safe operating area (SOA). The converter IC 200 is provided with a first supply voltages VDD and a second supply voltage (in this case ground (GND)). As such, the supply voltage range for the converter IC 200 is 0V-VDD. It may be advantageous for the core devices 208 to operate over an operating range less than that of the supply voltage range.

Coupled to the first and second external pins 204, 206 of the IC 200 are first and second amplifiers 210, 212 (in this example TIAs) which are each configured to output first and second voltages VOP, VON, each proportional to a respective output current IOUTP, IOUTN of the DAC 202. A DC bias of the output voltages VOP, VON is set by a reference voltage VREF provided to non-inverting inputs of the first and second amplifiers 210, 212. The reference voltage VREF is generated internally by the converter IC 200 and output via a third external pin 214 of the converter IC 200 to the first and second amplifiers 210, 212. A filter capacitor CFILT is provided between the third external pin 214 and ground. In some embodiments, the reference voltage VREF is set to a mid-point between the first and second supply voltages VDD, GND, i.e., VDD/2.

It will be appreciated that in the arrangement shown in FIG. 2, regulation of voltages at the external pins 204, 206, 214 is not under direct control of the converter IC 200. Extenuating circumstances at the external pins 204, 206, 214, such as short circuits, water ingress or the like, may cause voltages at the external pins 204, 206, 214 to move outside of normal operating range, for example, by exceeding the supply voltage range of the IC 200. Since outputs of the DAC 202 are coupled directly to the first and second external pins 204, 206, this in turn may cause the core devices 208 of the DAC 202 to operate outside of their SOAs which may result in stress and/or damage to the DAC 202.

Conventional electrostatic discharge (ESD) and electrical overstress (EOS) devices may go some way to protect against over-voltages at the external pins 204, 206, 214. However, such devices would only tend to protect against voltage moving outside of the supply voltage range of the converter IC 200 (e.g., GND to VDD). If core devices 208 have an operating voltage range which is smaller than that of the supply voltage range of the converter IC 200, such ESD or EOS devices may not protect such core devices 208 from exceeding their SOAs and causing stress and/or damage. Additionally, even if core devices 208 have a SOA which spans the supply voltage range of the converter IC 200, conditions during start-up/power-up of the converter IC 200 may cause the core devices 208 to operate outside of their SOA.

Embodiments of the present disclosure aim to address or at least ameliorate one or more of the above problems by providing protection circuitry on a converter IC which is configured to isolate one or more core devices of an integrated converter (such as a DAC or an ADC) upon detection of an condition which could lead to one or more core devices operating outside of its operating specification (i.e., safe operating area) or threshold. In some embodiments, one or more isolation switches are provided for isolating respective core devices from external pins of the converter IC when an out-of-range condition (e.g., overvoltage) is detected, for example at a respective external pin. In some embodiments, core devices may be controlled during start-up of the IC to ensure core devices continue to operate within their safe operating area (SOA) over the course of start-up of the converter IC. This is particularly applicable when the SOA of the core devices is less than the voltage domain of the converter IC itself, such as where the operating voltage range of the core devices is less than the operating voltage of the converter IC.

Figure 3:
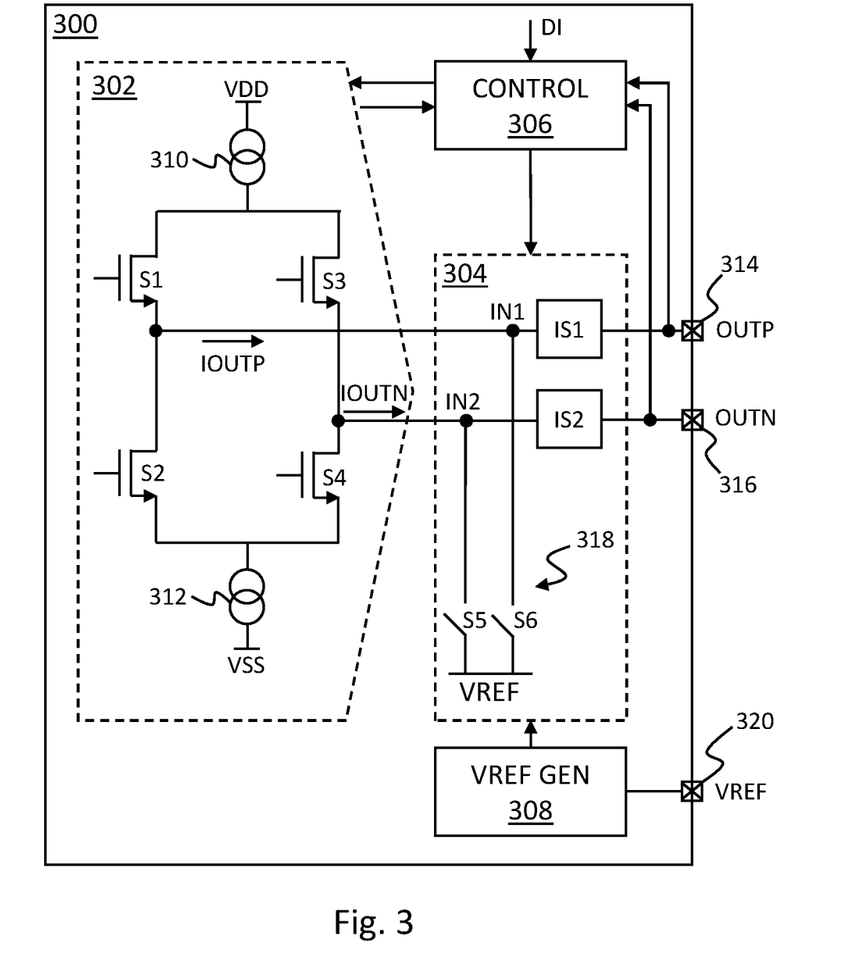
FIG. 3 is a schematic diagram of a converter IC.

FIG. 3 is a schematic diagram of a converter IC 300 according to embodiments of the present disclosure. The converter IC 300 comprises a DAC 302, protection circuitry 304 and control circuitry 306. Optionally, the converter IC 300 may also comprise a reference voltage generator 308.

In the illustrated embodiment, a DAC 302 is provided. It will be appreciated, however, that converter ICs of the present disclosure are not limited to having a DAC as a converter. In other embodiments, the DAC 302 may be replaced with another converter such as an ADC. Additionally or alternatively, additional converters (not shown) may be provided in the converter IC 300. For example, the converter IC 300 may be provided with the DAC 302 in addition to an ADC (not shown).

The DAC 302 comprises first, second, third and fourth core devices S1, S2, S3, S4, each comprising a semiconductor switch (MOSFET). Drains of the first and third core devices S1, S3 are coupled to a first supply voltage VDD via a first current source 310. Sources of the second and fourth core devices S2, S4 are coupled to a second supply voltage VSS via a second current source 312 (in this arrangement a current sink). The first supply voltage VDD is configured to be more positive than the second supply voltage VSS. For example, the first supply voltage may be set to 3.3V and the second supply voltage may be set to zero volts or ground.

A source of the first core device S1 and a drain of the second core device S2 are coupled to a first internal node IN1. A source of the third core device S3 and a drain of the fourth core device S4 are coupled to a second internal node IN2. As such, the first and second internal nodes IN1 IN2 are configured as differential outputs of the DAC 302. For clarity, a single unit cell of the DAC 302 is illustrated in FIG. 3. It will, however, be appreciated that the DAC 302 may comprise multiple unit cells substantially identical to that shown, each comprising four core devices arranged as shown in FIG. 3.

Figure 4A:
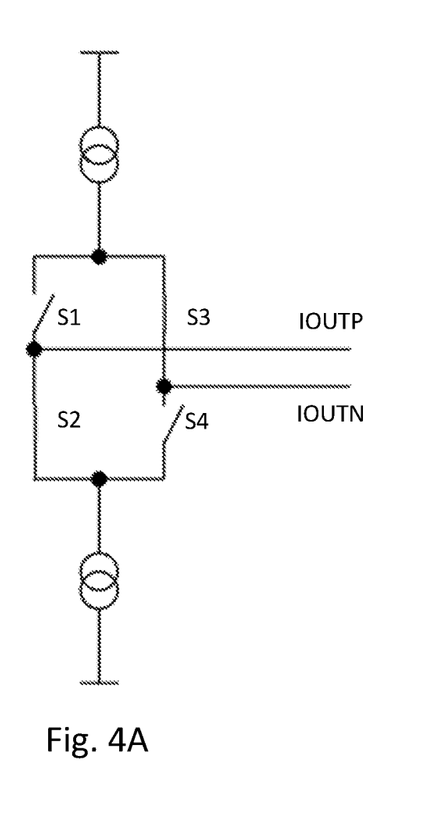
FIGS. 4A and 4B are schematic diagrams showing first and second switching configurations for a digital-to-analog converter of the converter IC of FIG. 3.
Figure 4B:
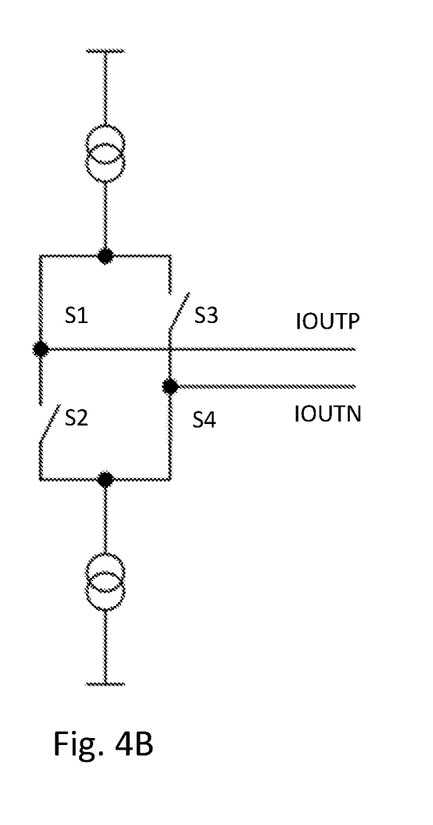

Gates of the first, second, third and fourth core devices S1:S4 are controlled, for example by the control circuitry 306 so as to supply first and second differential currents IOUTP, IOUTN to respective first and second internal nodes IN1, IN2. General operation of the DAC 302 is known in the art and so will not be described in detail here. Briefly, however, each of the core devices S1:S4 may be switched between conducting and non-conducting states by applying a first gate voltage VDDSW or a second gate voltage VSSSW at their gates, the first gate voltage VDDSW being more positive than the second gate voltage VSSSW. The core devices S1:S4 may be controlled such that when the first and fourth core devices S1, S4 are conducting, the second and third core devices S2, S3 are non-conducting as shown in FIG. 4A, and such that when the second and third core devices S2, S3 are conducting, the first and fourth core devices S1, S4 are non-conducting as shown in FIG. 4B. The duty cycle of switching of the core devices S1:S4 can be controlled to control the output currents IOUTP, IOUTN. The control circuitry 306 may control the duty cycle of switching of the core devices S1:S4 based on a digital input signal DI such that the DAC 302 operates to convert the digital input signal DI into an analog signal in the form of the differential output currents IOUTP, IOUTN.

Referring again to FIG. 3, the protection circuitry 304 is provided between the first internal nodes IN1, IN2 and first and second external pins 314, 316 of the converter IC 300. The protection circuitry 304 comprises first and second isolation switches IS1, IS2 (although any number of isolation switches may be provided). The isolation switches IS1, IS2 may comprise MOSFET devices (or any other suitable switching devices). The first isolation switch IS1 is coupled between the first internal node IN1 and the first external pin 314. The second isolation switch IS2 is coupled between the second internal node IN2 and the second external pin 316. As such, the first and second isolations switches IS1, IS2 are switchable to connect or disconnect (isolate) the first and second internal nodes IN1, IN2 from respective first and second external pins 314, 316 of the converter IC 300.

It will be appreciated that opening the first and/or second isolation switch IS1, IS2 may lead to significant voltage swings at respective first and/or second internal nodes IN1, IN2. This in turn may cause the core devices S1:S4 to operate outside of their SOA. To mitigate this risk, the protection circuitry may further comprise drive circuitry 318 configured to hold or clamp each of the first and second internal nodes IN1, IN2 at a reference voltage VREF when respective first and second isolation switch IS1, IS2 are open. The reference voltage VREF may be generated by the reference voltage generator 308. The reference voltage VREF may, for example, be set to the mid-point between the first and second supply voltage VDD, VSS, i.e., (VDD−VSS)/2.

In the embodiment shown, the drive circuitry 318 comprises a switch S5 coupled between the reference voltage VREF and the first internal nodes IN1 and a switch S6 coupled between the reference voltage VREF and the second internal node IN2. Closing of the switches S5, S6 causes the first and second internal nodes IN1, IN2 to be driven to the reference voltage VREF. In some embodiments, the drive circuitry 318 may be replaced with a plurality of voltage dividers, each voltage divider having an output (i.e., the connection of first and second resistances) coupled to a respective one of the first and second internal nodes IN1, IN2. Such voltage dividers may operate to pull the first and second internal nodes IN1, IN2 to the reference voltage VREF when the isolation switches IS1, IS2 are open.

The reference voltage generator 308 may be configured to output the reference voltage VREF to a reference external pin 320. The reference voltage VREF may be generated from the first and second supply voltages VDD, VSS in any manner known in the art.

Figure 5A:
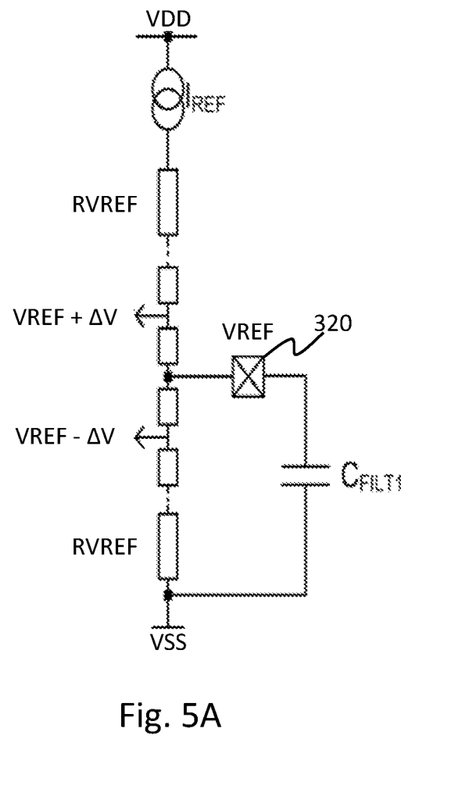
FIGS. 5A and 5B are schematic diagrams of example drive circuitry of the converter IC of FIG. 3.

In one example, the reference voltage generator 308 may utilise an available IC current reference IREF in the converter IC 300 as shown in FIG. 5A. A plurality of reference resistors RVREF are provided in series between the current reference IREF and the second supply voltage VSS. The current reference IREF is coupled to the first supply voltage VDD. The reference voltage VREF can be adjusted by selection of a tap in the chain of resistors RVREF from which to obtain the reference voltage VREF. Such an approach may provide a relatively high supply rejection, by use of the current from the current reference IREF. As is known in the art, a filter capacitor CFILT1 may be provided between the reference external pin 320 and the second supply voltage VSS. Due to the relatively high supply rejection, the approach shown in FIG. 5A may present lenient requirements for the filter capacitor CFILT1. For example, the size of the filter capacitor CFILT1 may be small when compared to other topologies (such as that described below). By reducing the size of the filter capacitor CFILT1, the time taken to charge the filter capacitor CFILT1 to the reference voltage VREF may be reduced. A disadvantage of the arrangement shown in FIG. 5A is that the reference voltage VREF is independent of the first supply voltage VDD. As such, fluctuations in the first supply voltage VDD will not be reflected in the reference voltage VREF and may lead to asymmetry in output of the DAC 302.

Figure 5B:
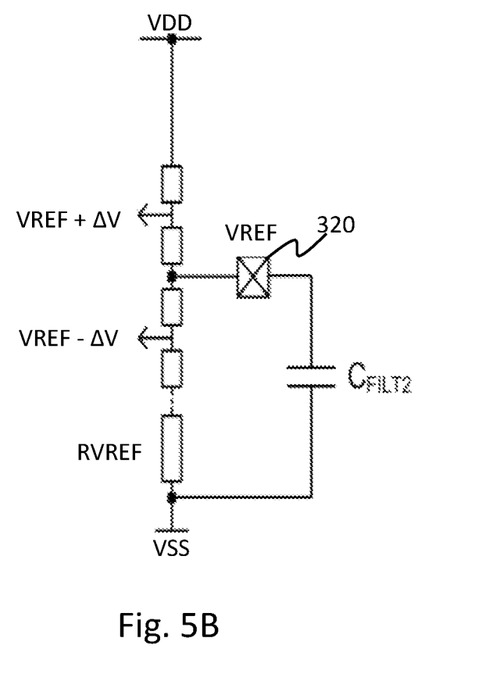

In another example shown in FIG. 5B, a resistive divider may be used to generate the reference voltage VREF. In this example, the reference voltage generator 308 comprises a plurality of reference resistors RVREF connected in series between the first and second supply voltage VDD, VSS. Again, the reference voltage VREF can be adjusted by selection of a tap in the chain of resistors RVREF from which to obtain the reference voltage VREF. This arrangement has the advantage that the reference voltage VREF scales with the values of the first and second supply voltage VDD, VSS, thereby maintaining symmetry in the output of the DAC 302. However, this approach may lead to relatively poor supply rejection when compared to the arrangement shown in FIG. 5A. A relatively large filter capacitor CFILT2 may be required to account for poor supply rejection, leading to a reduction in speed of charging of the filter capacitor CFILT2 to the reference voltage VREF.

In yet further examples, the reference voltage VREF may be generated using a bandgap voltage reference circuit or by stepping up or stepping down (gain adjusting) another reference voltage generated in the converter IC 300.

In view of the above, it will be appreciated that the reference voltage VREF may be used to bias one or more external amplifiers coupled to the external pins 314, 316, as well as for holding the internal nodes IN1, IN2 at the reference voltage VREF when the isolation switches IS1, IS2 are open. In some embodiments, the reference voltage generator 308 may generate independent/separate reference voltages VREF, one for output to the protection circuitry 304 and another for output to the reference external pin 320. In doing so, if the reference external pin 320 is erroneously pulled to an out-of-range voltage for some reason, the internal nodes IN1, IN2 are not also pulled to that out-of-range voltage. As such, an external condition at the reference external pin 320 does not affect operation of the core devices S1:S4 of the DAC 302, providing an added layer of protection for the core devices S1:S4.

It will be appreciated that during normal operation, external amplifiers coupled to the first and second external pins 314, 316 may set respective voltage levels at the first and second external pins 314, 316. By providing the reference voltage VREF from the converter IC 300, the converter IC can control the biasing of the external amplifiers coupled to the external pins 314, 316.

Figure 6:
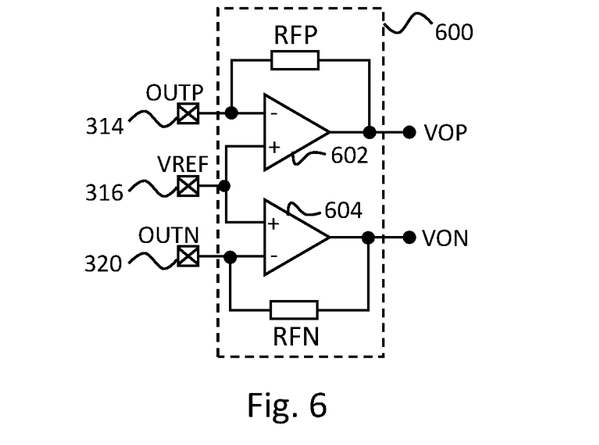
FIG. 6 is a schematic diagram of a gain stage configured to connection to the converter IC of FIG. 2 or 3.

FIG. 6 is a schematic diagram of an example gain stage 600 configured for coupling to the first, second and reference external pins 314, 316, 320. The gain stage 600 comprises a first amplifier 602 and a second amplifier 604. The first amplifier 602 comprises an inverting input coupled to the first external pin 314, a non-inverting input coupled to the reference external node 320 and a first feedback resistor RFP coupled between an output of the first amplifier 602 and the inverting input of the first amplifier 602. Thus, the first amplifier 602 is configured as a transimpedance amplifier to output a voltage VOP which is proportional to a current IOUTP at the first external pin 314. The second amplifier 604 comprises an inverting input coupled to the second external pin 316, a non-inverting input coupled to the reference external node 320 and a second feedback resistor RFN coupled between an output of the second amplifier 604 and the inverting input of the second amplifier 604. Thus, the second amplifier 604 is configured to output a voltage VON which is proportional to a current IOUTN at the second external pin 316.

The reference voltage VREF provided by the reference voltage generator 308 via the reference external pin 320 biases the first and second amplifiers 602, 604 and therefore sets respective voltages at the first and second external pins 314, 316, to VREF.

Referring again to FIG. 3, the control circuitry 306 may be configured to control each of the isolation switches IS1, IS2 and the drive circuitry 318 in dependence on one or more conditions or characteristics at each of the first and second external pins 314, 316. Such conditions may be associated with one or more external (off-chip) errors (such as one or both of the external pins 314, 316 being shorted to ground or experiencing water ingress, a soldering error, or electrostatic charging/discharging etc). The control circuitry 306 may monitor for such conditions, for example by monitoring a voltage, current and/or impedance at the external pins 314, 316. On determination that one or more conditions fall outside of a threshold range, the control circuitry 306 may be configured to control the first and second isolation switches IS1, IS2 and the drive circuitry 318 to disconnect (isolate) the internal nodes IN1, IN2 from the external pins 314, 316 of the converter IC 300, thereby limiting exposure of the core devices S1:S4 to the out of SOA condition at the external pins 314, 316. The threshold range may be selected so as to be a range of one or more conditions at the external pins 314, 316 which ensures the core devices S1:S4 continue to operate within their SOA and outside of which the core devices S1:S4 would operate outside of their SOA should the internal nodes IN1, IN2 and the external pins 314, 316 remain connected. Additionally or alternatively, the threshold range may be selected so as to ensure one or more elements of the converter IC continue to function correctly. For example, the threshold range may be selected to prevent one or more conditions in the converter IC do not fall outside of a functional operating range or region.

In one example, the control circuitry 306 is configured to monitor a voltage at one or both of the external pins 314, 316. If a voltage at one or both of the external pins 314, 316 exceeds an upper threshold, falls below a lower threshold or moves outside of a threshold range, the control circuitry 306 may be configured to open the isolation switches IS1, IS2 so as to isolate the internal nodes (and therefore the core devices S1:S4) from the external pins 314, 316. The control circuitry 306 may also be configured to close the switches S5, S6 so as to pull the internal nodes IN1, IN2 to the reference voltage VREF.

In one example, when the gain stage 600 is coupled to the converter IC 300, the external pins 314, 316 will be biased to the reference voltage VREF. The control circuitry 306 may determine whether the voltage at the external pins 314, 316 has drifted outside of a threshold range of the reference voltage VREF. For example, if the reference voltage is 1.65 V, the threshold range may be 200 mV.

It will be appreciated that the threshold voltage range used to control the protection circuitry 304 may be less than the range of supply voltages VDD, VSS provided to the DAC 302. This may be the case in instances where the operating voltage range of the core devices S1:S4 is less than the supply voltage range (VDD−VSS).

The control circuitry 306 may be configured to switch both isolation switches IS1, IS2 together (both open or both closed) based on a condition at one or both of the external pins 314, 316. Alternatively, the control circuitry 306 may be configured to independently switch the isolation switches IS1, IS2, for example in response to an out of threshold condition at one or both of the external pins 314, 316.

The above-described functionality of the control circuitry 306 may be implemented using any suitable topology. For example, the control circuitry 306 may be implemented using one or more comparators configured to compare various voltage, such as those at the external pins 314, 316 with one or more threshold voltages.

The threshold voltage may be generated, for example, by the reference voltage generator or another module (not shown). With reference to FIGS. 5A and 5B, for example, voltages VREF+ΔV and VREF−ΔV may be used as inputs to one or more comparators for determining whether the voltage at one or both of the first and second external pins 314, 316 has drifted more than +/−ΔV away from the reference voltage VREF. A trim capability may be provided within the reference voltage generator 308 to enable the +/−ΔV range to be extended or reduced, depending on requirements.

Any combination of comparators may be used to compare voltages at the external pins 314, 316 with the threshold voltages (e.g., VREF+ΔV and VREF−ΔV). For example, a comparator may be provided for each comparison of a voltage at an external pin 314, 316 with a threshold voltage. Alternatively, to reduce hardware overheads, one or more comparators may be multiplexed, for example using clocked multiplexers. For example, each external pin 314, 316 may be monitored against each reference (e.g., REF+ΔV and VREF−ΔV) for half a clock period. Alternatively each of the external pins 314, 316 may be compared with a single reference during a particular phase of the clock.

Under certain conditions, powering up of the converter IC 300 may cause core devices, such as the core devices S1:S4 to operate outside of the SOA, which can lead to damage of the DAC 302. To avoid such damage, the control circuitry 306 may be configured to control the first and second gate voltage VDDSW, VSSSW and the reference voltage VREF during start up, to ensure safe operation of the core devices S1:S4.

This start-up control regime will now be described in respect of an example implementation of the DAC 302 shown in FIG. 7. In this example, the first supply voltage VDD is 3.3V, the second supply voltage VSS is 0V (ground), and each of the core devices S1:S4 has a SOA of 1.3V (i.e., the voltage across any two terminals (gate, source and drain) of each of the core devices S1:S4 should not exceed 1.3V). The converter IC 300 is coupled to the gain stage 600 of FIG. 6 such that the first and second external pins 314, 316.

As noted above with reference to FIGS. 4A and 4B, during steady state operation, the gates of the core devices S1:S4 are switched between first and second gate voltage VDDSW, VSSSW so as to ensure that one of the first and second core devices S1, S2 and one of the third and fourth core devices S3, S4 are turned on. Doing so ensures that a drain-source voltage VDS across each of the core devices S1:S4 is maintained within the SOA of the core devices S1:S4. The gate voltages VDDSW, VSSSW are generated by first and second gate voltage regulators 702, 704, which may be implemented as part of the control circuitry 306, or part of the reference voltage generator 308 or as standalone modules on the converter IC 300. The first and second gate voltage regulators 702, 704 may be implemented as low drop-out regulators (LDOs) or the like.

It will be appreciated that during initial start-up, the first and/or second gate voltage regulators 702, 704 may take time to initialise, during which time they will be disabled. During this time, the DAC 302 will also be disabled. Whilst disabled, the first and second gate voltages VDDSW, VSSSW provided by the gate voltage regulators 702, 704 will be 0V.

However, when the converter IC 300 is first powered up and whilst the gate voltage regulators 702, 704 are initialising, the first supply voltage VDD almost immediately rises to 3.3V. This, combined with the first and second gate voltages VDDSW, VSSSW being at 0V, would cause all of the core devices S1:S4 to remain switched off, which would in turn result in an unacceptably high drain source voltage across the core devices S1:S4.

To avoid this scenario, the control circuitry 306 may be configured to drive the first gate voltage VDDSW during periods in which the first gate voltage regulator 702 is disabled and/or drive the second gate voltage VSSSW during periods in which the second gate voltage regulator 704 is disabled.

Figure 8:
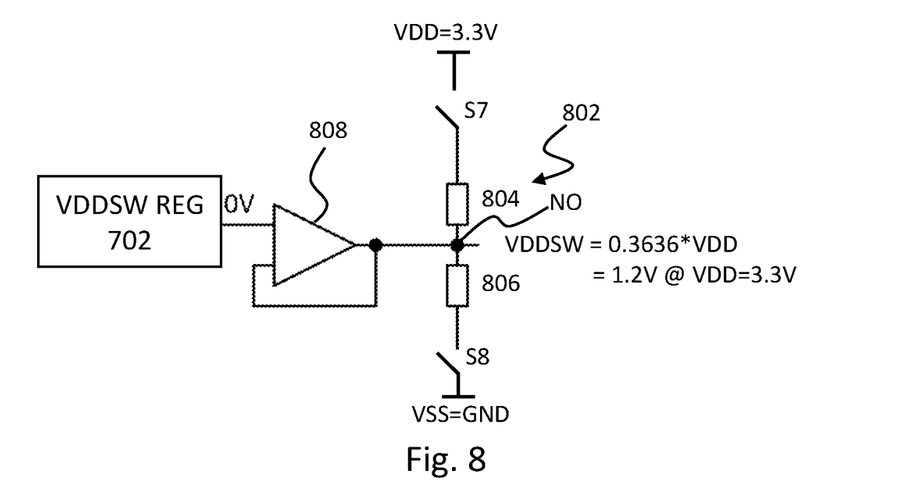
FIG. 8 is a schematic diagram of circuitry for driving gates of core devices of the DAC of FIG. 3.

FIG. 8 provides an example circuit 800 for driving the first gate voltage VDDSW. The circuit 800 comprises a voltage divider 802 comprising first and second resistors 804, 806 switchably connected in series between the first and second supply voltages VDD, VSS. The first resistor 804 is switchably coupled to the first supply voltage VDD via a high-side switch S7. The second resistor 806 is switchably coupled to second supply voltage VSS via a low-side switch S8. The first and second resistors are coupled to each other at an output node NO. A buffer 808 is provided to buffer the output voltage VDDSW from the first voltage regulator 702 which is at 0V when the first voltage regulator is disabled. When the high- and low-side switches S7, S8 are closed, the voltage divider 802 pulls the output of the VDDSW regulator to a voltage sufficient to drive respective core devices S1:S4 on but low enough not to cause an SOA condition at respective core devices S1:S4 (i.e., an operating voltage of the core devices S1:S4, in this example 1.2V). The voltage divider 802 can be disabled by opening the high- and low-side switches S7, S8, thereby disconnecting the first and second resistors 804, 806 from respective first and second supply voltages VDD, VSS.

Since the second gate voltage regulator 704 is also being initialised at this point (and is therefore disabled), the second gate switch voltage VSSSW may be set by the reference voltage VREF. During start-up, the reference voltage VREF may be set to 0V such that the second gate switch voltage VSSSW is also set to 0V.

Thus, the gates of the core devices S1:S4 are switched between 0V and 1.2V and the reference voltage VREF is at 0V. Under these conditions during start-up, operation of the core devices S1:S4 is maintained within their SOA.

Figure 9:
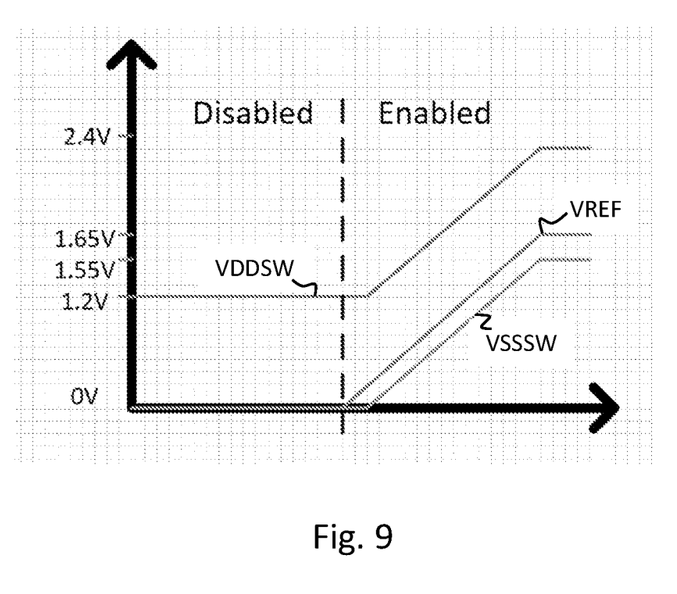
FIG. 9 is a voltage vs time plot for various signals applied in the converter IC of FIG. 3.

Once the first and second voltage regulators 702, 704 have been initialised, the reference voltage VREF is provided to the external pins 314, 316 and to the internal nodes IN1, IN2 transitions from 0V to VDD/2=1.65V (or similar intermediate voltage between VDD and VSS). FIG. 9 graphically illustrates the transition of the first and second gate voltage VDDSW, VSSSW and the reference voltage VREF when the DAC 302 and the voltage regulators 702, 704 are enabled. To ensure the core devices S1:S4 continue to operate within SOA, the first and second gate voltages VDDSW, VSSSW are controlled to track the reference voltage VREF. This ensures that in each of the core devices S1:S4, the gate, source and drain are maintained within 1.3V of each other. To achieve this tracking, as the reference voltage VREF is increased to its steady state operating voltage (e.g., 1.65V):

The second gate voltage VSSSW increases with the reference voltage VREF, preferably with a fixed offset relative to the reference voltage VREF, for example VREF-100 mV. The second gate voltage VDDSW is controlled to be offset from the reference voltage VREF by 100 mV to ensure each of the core devices S1:S4 are driven completely off when the second gate voltage VSSSW is applied to their respective gates. 100 mV is provided an example, non-limiting, voltage offset.

The first gate voltage VDDSW increases with the second gate voltage VSSSW with a fixed offset, for example 0.85V above the second gate voltage VSSSW, i.e., VREF+0.85=2.4V. The offset is chosen to be larger than a threshold voltage of the core devices S1:S4 but smaller than the SOA limit of the core devices S1:S4. The first gate voltage VDDSW is maintained at a fixed threshold above the second gate voltage VSSSW to ensure respective core devices S1:S4 are driven on when the first gate voltage VDDSW is applied to their respective gates.

Figure 7:
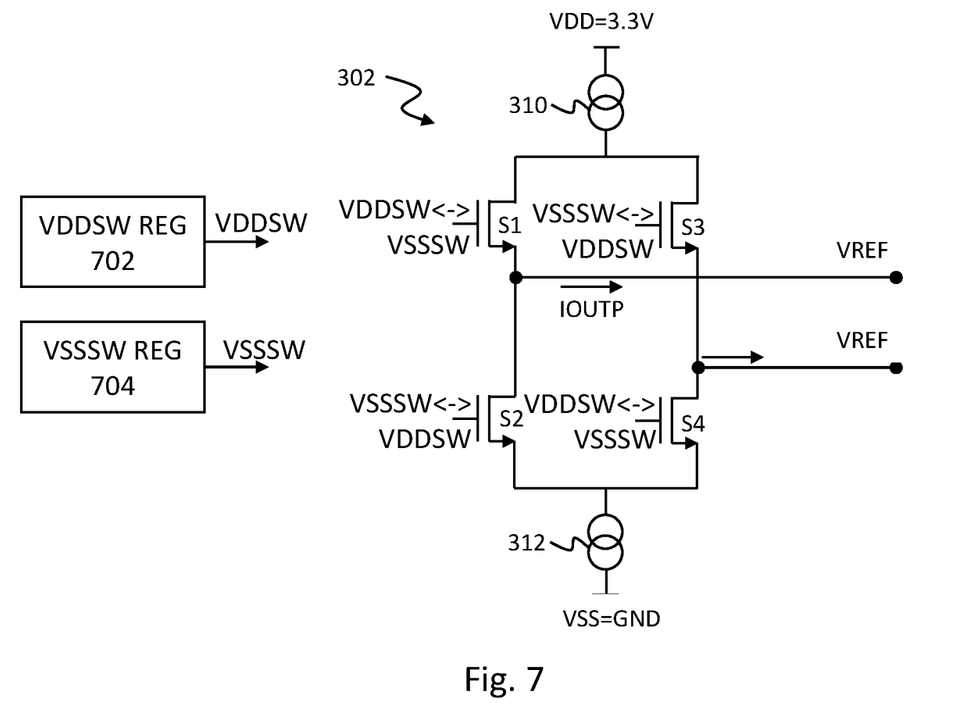
FIG. 7 is a schematic diagram illustrating an operating mode of the DAC of FIG. 3.

As noted above, the values shown in the example described with reference to FIGS. 7 to 9 are examples only. In more general terms, the control circuitry 306 is configured to control the first and second gate voltages VDDSW, VSSSW and the reference voltage VREF during two phases of start-up. In a first phase, during which the first and/or second gate voltage regulators 702, 704 are disabled, the control circuitry 306 is configured to generate the first gate voltage VDDSW so as to ensure that one of the first and second core devices S1, S2 and one of the third and fourth core devices S3, S4 are switched on, whilst not driving respective gates to a voltage which would exceed a respective one of the core devices S1:S4 SOAs. In a second phase, during which the reference voltage VREF is increased to a voltage between the first and second supply voltages VDD, VSS, the first and second gate voltage regulators 702, 704 are configured to ensure the first and second gate voltages VDDSW, VSSSW also increase with the reference voltage VREF to ensure that any voltage drop between any two terminals of each of the core devices S1:S4 remains within a SOA (e.g., 1.3V in the example of FIG. 7). Thus, the gates, sources and drains of the core devices S1:S4 are maintained within SOA range of each other as the output level increases from ground (when the converter IC 300 is unpowered) to the operational reference voltage VREF of the DAC (e.g., 1.65V). Under these conditions, operation of the core devices S1:S4 is maintained within their SOA.

As noted above, it is preferable to decouple generation of the reference voltage VREF for the internal nodes IN1, IN2 and the reference external pin 320. However, this is equally applicable when considering generation of the first and second gate voltages VDDSW, VSSSW. Since each of the first and second gate voltages VDDSW, VSSSW are linked to the reference voltage VREF, such voltages may be derived from the reference voltage VREF. In which case, it is advantageous to decouple the reference voltage VREF used for guaranteeing SOA (i.e., for generating the second gate voltage VSSSW) from the reference voltage VREF used to bias external amplifier, such as the gain stage 600.

It will be appreciated that internal and external reference voltages VREF may have different specification requirements. For example, the reference voltage VREF provided externally is preferably low noise, can be externally decoupled, and does not need to provide more than a few microamps of current. In contrast, the reference voltage VREF provided for internal use does not need to be low noise, but preferably needs to be able to sink and source current in the DAC 302 to maintain the voltages at the internal nodes IN1, IN2 at the reference voltage VREF when the isolation switches IS1, IS2 are open.

In embodiments described herein, a differential arrangement is shown. It will be appreciated that the present disclosure is not limited to such arrangements and the novel solutions described herein are equally applicable to single ended arrangements.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone. Embodiments may be implemented in a wearable host device, such as a smart watch, a chest or wrist strap, smart glasses, a virtual reality or augmented headset. Embodiments may be implemented in a host device comprising a vehicle, such as an automotive vehicle (e.g., car or motorcycle), aeroplane, helicopter or the like.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. An audio converter integrated circuit (IC), comprising:
a converter comprising:
one or more core devices; and
one or more internal nodes, each internal node coupled to one of the one or more core devices;
protection circuitry comprising:
one or more isolation switches, each of the one or more isolation switches coupled between a respective one of the one or more internal nodes and a respective external pin of the IC, wherein the protection circuitry configured to:
monitor a characteristic at each respective external pin of the IC; and
if the characteristic is outside an operating specification of the one or more core devices, open one or more of the one or more isolation switches to isolate one or more of the one or more core devices from the respective external pin of the IC.

2. The audio converter IC of claim 1, wherein the characteristic comprises one or more of:
a voltage;
a current; and
an impedance.

3. The audio converter IC of claim 1, wherein the operating specification is set to maintain operation of the one or more core devices in a safe operational area (SOA).

4. The audio converter IC of claim 1, wherein the one or more core devices have a safe operating voltage less than a supply voltage of the IC.

5. The audio converter IC of claim 1, wherein the characteristic comprises an output voltage, and wherein the protection circuitry comprises:
at least one comparator configured to compare the output voltage with an internal reference voltage; and open the one or more isolation switches based on the comparison.

6. The audio converter IC of claim 1, further comprising: drive circuitry configured to hold the one or more internal nodes at an internal reference voltage when the one or more isolation switches are open.

7. The audio converter IC of claim 6, wherein the drive circuitry comprises one or more potential dividers configured to hold the one or more internal nodes at the internal reference voltage.

8. The audio converter IC of claim 6, wherein the drive circuitry comprises a current source configured to generate the internal reference voltage.

9. The audio converter IC of claim 7, wherein the drive circuitry is configured to output an external reference voltage at a reference voltage pin of the IC, a level of the external reference voltage being equal to a level of the internal reference voltage, the external reference voltage being generated separately to the internal reference voltage.

10. The audio converter IC of claim 6, wherein the one or more core devices each comprise a transistor having a gate, a source and a drain.

11. The audio converter IC of claim 10, wherein the converter comprises converter control circuitry configured to:
apply a gate voltage to respective gates of the one or more core devices, the gate voltage switched between a first gate voltage level and a second gate voltage level.

12. The audio converter IC of claim 11, wherein during start-up of the IC, the first gate voltage level is set to within a first threshold of a supply voltage of the IC, wherein the converter control circuitry is configured to:
apply the gate voltage to a respective gate of the one or more core devices, a difference between the first gate voltage level and the internal reference voltage of the IC being within a safe operating range of one or more core devices.

13. The audio converter IC of claim 10, wherein the first and second gate voltage levels are derived from the internal reference voltage.

14. The audio converter IC of claim 10, wherein when the converter is disabled, the first gate voltage level is set to an operating voltage of the respective core device of the one or more core devices or set above a first threshold of the internal reference voltage.

15. The audio converter IC of claim 10, wherein when the converter is enabled, the second gate voltage level is set to within a second threshold of the internal reference voltage.

16. The audio converter IC of claim 15, wherein the second gate voltage level is set to be at or below the internal reference voltage.

17. The audio converter IC of claim 1 wherein the converter comprises one or more of:
a digital-to-analog converter (DAC); and
an analog-to-digital converter (ADC).

18. The audio converter IC of claim 17, wherein the DAC comprises a differential current DAC, wherein the one or more internal nodes comprise a first internal node and a second internal node, wherein the DAC comprises a differential current DAC comprising:
a first switch coupled between a first internal node and a first current source;
a second switch coupled between the first internal node and a second current source;
a third switch coupled between a second internal node and the first current source; and
a fourth switch coupled between the second internal node and the second current source,
wherein the first current source is coupled to a first supply voltage of the audio converter IC and the second current source is coupled to a second supply voltage of the audio converter IC, the first supply voltage more positive than the second supply voltage.

19. An audio converter integrated circuit (IC), comprising:
a converter comprising:
one or more core devices; and
one or more internal nodes, each internal node coupled to one of the one or more core devices;
protection circuitry comprising:
one or more isolation switches, each of the one or more isolation switches coupled between a respective one of the one or more internal nodes and a respective external pin of the audio converter IC, wherein the protection circuitry configured to:
monitor a characteristic at each respective external pin of the audio converter IC; and
if the characteristic falls outside of an functional operating region of the converter, open one or more of the one or more isolation switches to isolate one or more of the one or more core devices from the respective external pin of the IC.

20. An audio converter IC, comprising:
a converter comprising:
one or more core devices; and
one or more internal nodes, each internal node coupled to one of the one or more core devices;
protection circuitry comprising:
one or more isolation switches, each of the one or more isolation switches coupled between a respective one of the one or more internal nodes and a respective external pin of the audio converter IC; and
a reference voltage generator configured to provide a first reference voltage to the protection circuitry and to provide a second reference voltage to an reference external pin of the converter IC.

21. A system comprising:
an audio converter integrated circuit (IC), comprising:
a current digital-to-analog converter (IDAC) comprising a plurality of core devices, the differential IDAC configured to receive a digital input and switch the plurality of core devices to output an output current to one or more internal nodes, the pair of internal nodes switchably coupled to one or more external pins of the audio converter IC;
a reference voltage generator configured to output a reference voltage to a reference external pin of the audio converter IC; and
a gain stage coupled to the one or more external pins and the reference external pin, the gain stage configured to apply gain to the differential output current.

22. A system, comprising:
the audio converter IC of claim 1; and
a gain stage coupled to the one or more external pins of the IC.

23. The system of claim 22, further comprising:
an audio transducer coupled to the gain stage, the gain stage configured to drive the audio transducer.

24. An electronic device comprising the system of claim 22, wherein the device comprises one of a wearable device, a vehicle, a mobile computing device, a laptop computer, a tablet computer, a games console, a remote-control device, a home automation controller or a domestic appliance, a toy, a robot, an audio player, a video player, or a mobile telephone, and a smartphone.

\* \* \* \* \*